(12) United States Patent
Menut et al.

(10) Patent No.: US 6,756,279 B2
(45) Date of Patent: Jun. 29, 2004

(54) METHOD FOR MANUFACTURING A BIPOLAR TRANSISTOR IN A CMOS INTEGRATED CIRCUIT

(75) Inventors: Olivier Menut, Saint Martin d'Heres (FR); Hervé Jaouen, Meylan (FR); Guillaume Bouche, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/209,190

(22) Filed: Jul. 30, 2002

(65) Prior Publication Data

US 2003/0027383 A1 Feb. 6, 2003

(30) Foreign Application Priority Data

Jul. 31, 2001 (FR) .............................................. 01 10270

(51) Int. Cl.$^7$ ......................................... H01L 21/8228
(52) U.S. Cl. ...................................... 438/322; 438/309
(58) Field of Search ................................ 438/322, 309, 438/217

(56) References Cited

U.S. PATENT DOCUMENTS

| | | | |
|---|---|---|---|
| 5,153,146 A | | 10/1992 | Toyoshima et al. |
| 6,218,253 B1 | * | 4/2001 | Kishi .......................... 438/309 |
| 6,297,119 B1 | * | 10/2001 | Tsutsui et al. ............... 438/322 |

FOREIGN PATENT DOCUMENTS

WO    WO 85/00694 A1    2/1985

OTHER PUBLICATIONS

French Search Report from French Patent Application No. 01/10270, filed Jul. 31, 2001.
Patent Abstracts of Japan, vol. 2000, No. 07, Sep. 29, 2000 & JP 2000 100827 A (NEC Corp.), Apr. 7, 2000.
Patent Abstracts of Japan, vol. 018, No. 008 (E–1486), Jan. 7, 1994 & JP 05 251358 A (NEC Corp.), Sep. 28, 1993.
Patent Abstracts of Japan, vol. 007, No. 292 (E–219), Dec. 27, 1983 & JP 58 168275 A (Fujitsu KK), Oct. 4, 1983.
Patent Abstracts of Japan, vol. 015, No. 108 (E–1045), Mar. 14, 1991 & JP 03 001568 A (Seiko Epson Corp.), Jan. 8, 1991.
Patent Abstracts of Japan, vol. 014, No. 524 (E–1003), Nov. 16, 1990 & JP 02 220444 A (Seiko Epson Corp.), Sep. 3, 1990.
Patent Abstracts of Japan, vol. 018, No. 311 (E–1561), Jun. 14, 1994 & JP 06 069225 A (Toshiba Corp.), Mar. 11, 1994.
Patent Abstracts of Japan, vol. 1995, No. 03, Apr. 28, 1995 & JP 06 333869 A (Sony Corp.), Dec. 2, 1994.

* cited by examiner

*Primary Examiner*—Matthew Smith
*Assistant Examiner*—Victor Yevsikov
(74) *Attorney, Agent, or Firm*—Lisa K. Jorgenson; William R. McClellan; Wolf, Greenfield & Sacks, P.C.

(57) ABSTRACT

A method for manufacturing a contact between a semiconductor substrate and a doped polysilicon layer deposited on the substrate with an interposed insulating layer, wherein elements adapted to making the insulating layer permeable to the migration of dopants from the polysilicon layer to the substrate are implanted.

20 Claims, 3 Drawing Sheets

METHOD FOR MANUFACTURING A BIPOLAR TRANSISTOR IN A CMOS INTEGRATED CIRCUIT

BACKGROUND OF THE INVENTION

1. Field of the Invention

The present invention relates to the manufacturing of integrated circuits.

2. Discussion of the Related Art

Technology, as it advances, provides more and more complex integrated circuits integrating a great number of components of different types, particularly, CMOS transistors and bipolar transistors. The conventional forming of such structures necessitates a large number of manufacturing steps due to the fact that steps specific to the manufacturing of bipolar transistors must be added to the manufacturing steps of a CMOS circuit.

It is thus a constant object of research in the field of integrated circuit manufacturing to search for manufacturing methods enabling simultaneous optimization of components of different types while minimizing the number of manufacturing steps. In particular, it is desired to make the largest possible number of steps common when manufacturing bipolar transistors and MOS transistors on an integrated circuit.

SUMMARY OF THE INVENTION

The present invention aims at the simultaneous manufacturing of bipolar and MOS transistors on an integrated circuit in which a large number of manufacturing steps of the bipolar transistors remain common with the MOS transistor manufacturing steps.

More specifically, the present invention aims at the manufacturing of an emitter of a bipolar transistor similarly to the manufacturing of the gate of a MOS transistor.

More generally, the present invention aims at forming a contact between a doped polysilicon layer and an underlying substrate, despite the presence of a thin insulating layer between them.

To achieve these and other objects, the present invention provides a method for manufacturing a contact between a semiconductor substrate and a doped polysilicon layer deposited on the substrate with an interposed insulating layer, in which elements adapted to making the insulating layer permeable to the migration of dopants from the polysilicon layer to the substrate are implanted through the polysilicon layer.

According to an embodiment of the present invention, the insulating layer is a silicon oxide layer.

According to an embodiment of the present invention, said elements are formed of hydrogen.

According to an embodiment of the present invention, said elements are formed of silicon or germanium.

The present invention also provides a method for manufacturing the emitter area of a bipolar transistor in a CMOS-type integrated circuit wafer, including the steps of forming, on the wafer, an insulating layer topped with a polysilicon layer over the entire integrated circuit; in the bipolar transistor area, implanting through the polysilicon layer elements adapted to making the insulating layer permeable to the migrating of dopants from the polysilicon layer; and removing the polysilicon layer and the insulating layer outside of locations where the emitter of the bipolar transistor and the gates of the MOS transistors are desired to be formed.

According to an embodiment of the present invention, the insulating layer is a silicon oxide layer.

According to an embodiment of the present invention, the implantation step includes the implantation of silicon or germanium.

According to an embodiment of the present invention, the implantation step includes the implantation of hydrogen.

The present invention also aims at a method for manufacturing a bipolar transistor in an integrated circuit of CMOS type, including the steps of forming, in the integrated circuit substrate, a region adapted to forming the collector area of the bipolar transistor; implanting in the region a doped region adapted to forming the base of the bipolar transistor; and forming the emitter of the bipolar transistor by the previously mentioned method.

The present invention also aims at a method for manufacturing the emitter area of a bipolar transistor in a CMOS-type integrated circuit, including the steps of implanting, in the bipolar transistor area, an element able to prevent formation of an electrically insulating zone on the said bipolar transistor area; forming an insulating area over the entire integrated circuit; and removing the polysilicon layer and the insulating area outside of the locations where the bipolar transistor emitter and the MOS transistor gates are desired to be formed.

The foregoing objects, features and advantages of the present invention will be discussed in detail in the following non-limiting description of specific embodiments in connection with the accompanying drawings.

DETAILED DESCRIPTION

Figure 1:
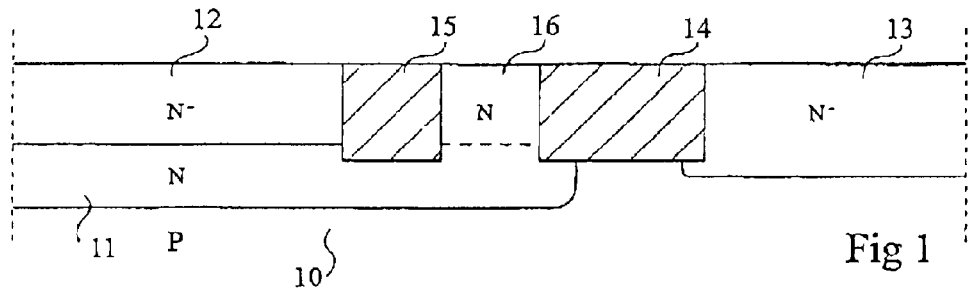
FIGS. 1 to 6 are simplified cross-section views illustrating successive steps of simultaneous manufacturing of a MOS transistor and of a bipolar transistor.

It should be noted that in these different drawings, as usual in the representation of integrated circuits, the thicknesses and lateral dimensions of the various layers are drawn to scale neither within a same drawing, nor from one drawing to the other, to improve the readability of these drawings. Further, the same references will designate the same elements or layers, possibly at successive manufacturing stages. Finally, only those steps necessary to understanding the method according to the present invention will be described in detail hereafter, and the intermediary steps, well known by those skilled in the art, will not be described in detail.

The forming on an integrated circuit of a P-channel MOS transistor in the right-hand portion and the manufacturing of an NPN-type bipolar transistor in the left-hand portion of FIGS. 1 to 6 will be described hereafter as an example. Of course, parallel to the forming of NPN-type transistors and of P-channel MOS transistors, N-channel MOS transistors which are not shown in the drawings for clarity are also formed on the integrated circuit.

FIG. 1 shows an integrated circuit wafer including a P-type semiconductor substrate 10. On the bipolar transistor side, an N-type region 11 is topped with a more lightly-doped N-type region 12. On the side of the P-channel MOS transistor, an N-type region 13 is formed at the same time as region 12. A main trench 14 filled with an insulator, for example, silicon oxide, separates the bipolar transistor area from that of the P-channel MOS transistor. On the bipolar transistor side, an auxiliary trench 15 filled with an insulator delimits with main trench 14 an N-type well 16 connecting the wafer surface to N-type region 11, located under N-type region 12.

Figure 2:
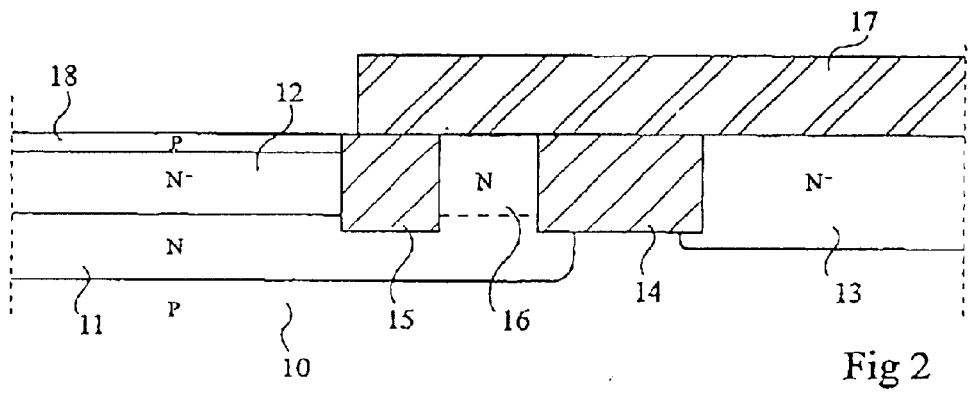

On FIG. 2, a mask 17 covers the P-channel MOS transistor area. A P-type dopant is implanted, to form a P-type region 18 at the surface of N-type region 12 of the bipolar transistor area. Region 18 is intended to form the base of the bipolar transistor.

Figure 3:
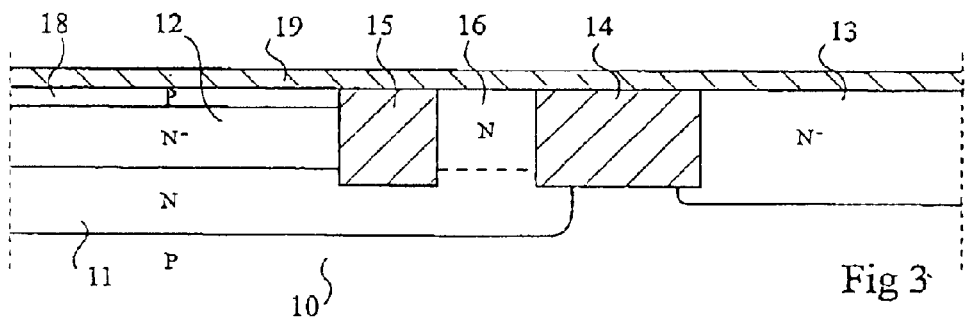

At the step shown on FIG. 3, a gate oxide layer 19, for example, silicon oxide, for example having a 1.5-nm thickness, is grown over the entire outer surface of the wafer.

Figure 4:
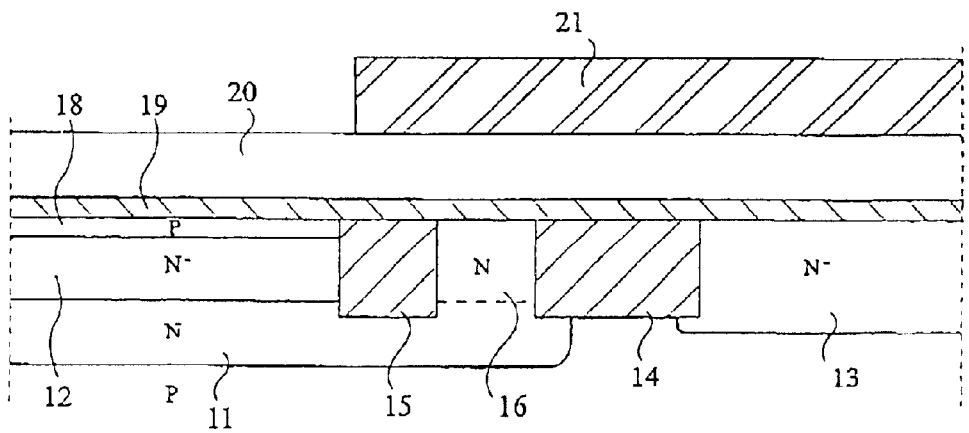

On FIG. 4 is shown a polysilicon layer 20, for example having a 0.2-$\mu$m thickness, deposited over gate oxide layer 19, and covered, at the level of the P-channel MOS transistor area, with a mask 21.

According to a first embodiment of the present invention, a hydrogen implantation is then performed in oxide layer 19 through polysilicon layer 20 unprotected by mask 21, that is, at the level of the bipolar transistor area. The implantation is, for example, performed under a 10-keV energy, and with a dose from $10^{15}$ atom/cm$^2$ to $10^{17}$ atom/cm$^2$. Polysilicon layer 20 is N-type doped at the level of the bipolar transistor and of the N-channel MOS transistor (not shown) and is P-type doped at the level of the P-channel MOS transistor.

Figure 5:
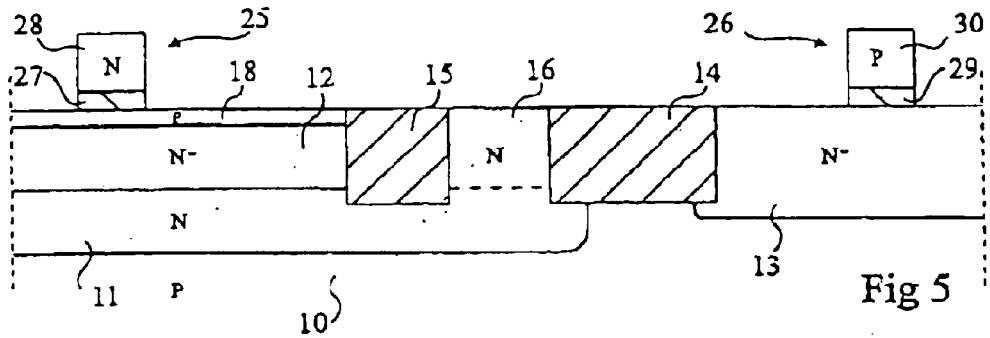

FIG. 5 illustrates the structure obtained after removal of polysilicon layer 20 and of gate oxide 19 except on the location where the emitter of the bipolar transistor and the gate of the P-channel MOS transistor are desired to be formed. On the bipolar transistor side, a first multiple-layer 25 formed of a portion 27 of gate oxide layer 19 in which a hydrogen implantation has been performed, topped with a portion 28 of polysilicon layer 20, is obtained. On the P-channel MOS transistor side, a second multiple-layer 26 intended to form the gate of the P-channel MOS transistor also includes an unmodified portion 29 of gate oxide layer 19 topped with a portion 30 of polysilicon layer 20.

Figure 6:
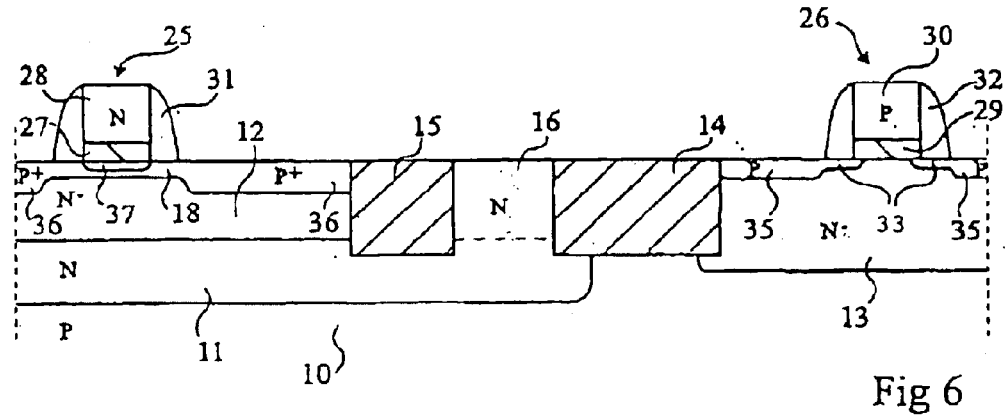

FIG. 6 schematically shows subsequent manufacturing steps of the transistors. An implantation of P-type dopants is performed to form, on either side of second multiple-layer 26, regions designated with reference 33. After the implantation, spacers designated with reference 31 at the level of first multiple-layer 25 on the bipolar transistor side and spacers designated with reference 32 at the level of second multiple-layer 26 on the P-channel MOS transistor side are formed. Then, a second implantation of P-type dopants is performed, to form heavily-doped regions on either side of the first and second multiple-layers. The extrinsic base regions 36 of the bipolar transistor and drain and source regions 35 of the P-channel transistor are thus formed.

An activation anneal is generally performed at this step, for example, at a 1,000° C. temperature and for a duration of 10 seconds. During this anneal, the hydrogen implanted in gate oxide portion 27 on the bipolar transistor side combines, according to a conventional oxidation-reduction reaction, with the SiO$_2$ molecules.

The reduction of gate oxide portion 27 by hydrogen modifies its properties. In particular, this oxide portion 27 no longer opposes the migration of the N-type dopants present in polysilicon portion 28 to P-type region 18, to form an emitter area 37. An NPN-type transistor having its emitter corresponding to region 37 in contact with polysilicon portion 28 is thus obtained, its base corresponding to the P-type doped region 18 extending to reach extrinsic base regions 36, and its collector corresponding to the N-type region 12 extending in region 11 and well 16. Further, upon operation of the NPN-type transistor, oxide portion 27 no longer opposes the passing of the charge carriers, that is, oxide portion 27 becomes conductive.

According to a second embodiment of the present invention, instead of implanting hydrogen in gate oxide layer 19, silicon or germanium is implanted. The implantation is performed, for example, with a dose from $10^{15}$ to $10^{17}$ atoms/cm$^2$. A significant factor at this step is the current with which silicon or germanium are implanted. Indeed, the silicon or germanium ions alter the structure of gate oxide layer 19. This alteration of the oxide essentially occurs during the silicon or germanium ion implantation and not during the activation anneal as was the case for the first embodiment. The silicon or germanium current will for example be from 10 to 100 $\mu$A.

The silicon or germanium implantation risks damaging the underlying layers, that is, P-type base region 18. However, during one of the anneal steps, a reconstruction of the crystalline material will occur.

Figure 7:
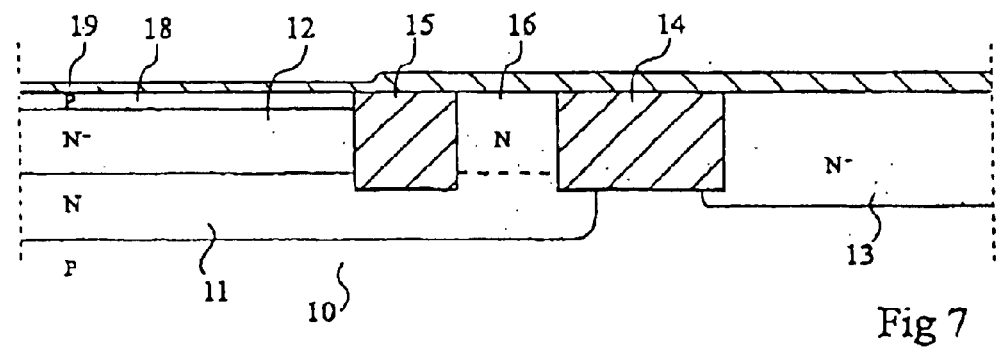
FIGS. 7 to 9 are simplified cross-section views illustrating a third embodiment of the steps of FIGS. 3 to 6.
Figure 8:
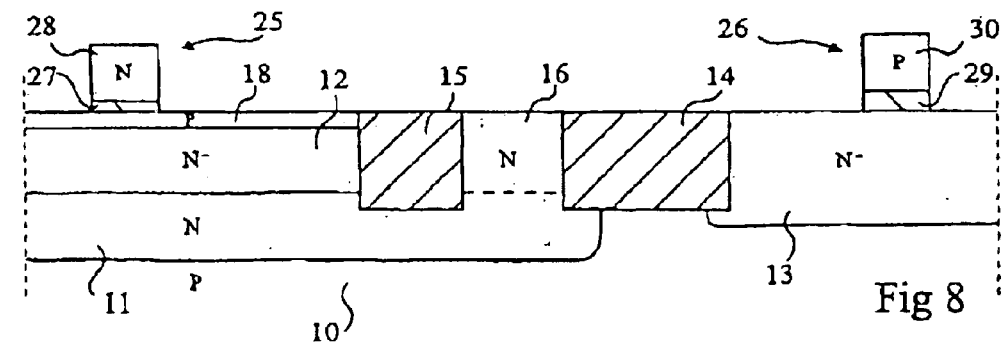
Figure 9:
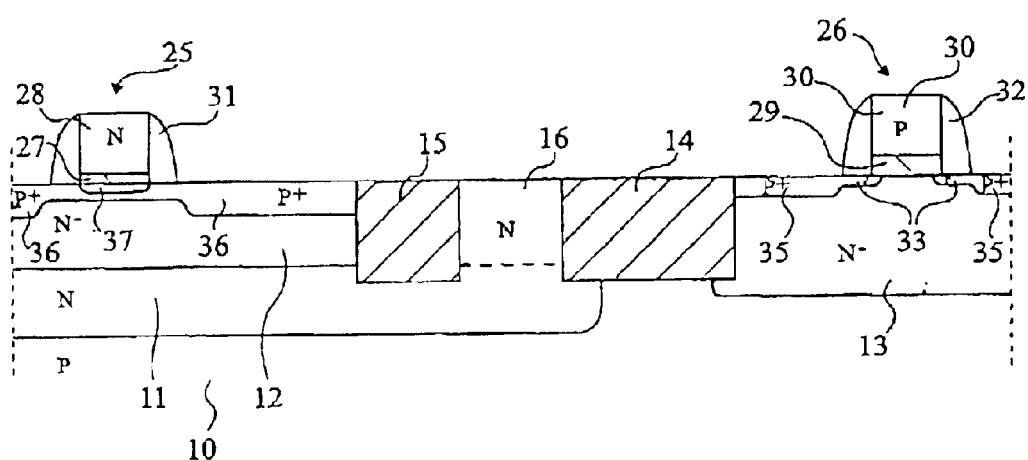

A third embodiment of the present invention is shown in FIGS. 7 to 9. A nitrogen implantation on the bipolar transistor area is performed before the forming of gate oxide layer 19, in P-type region 18 intended to form the base of the bipolar transistor. The nitrogen implantation is performed, for example, at a dose from $10^{14}$ to $10^{16}$ atom/cm$^2$.

As shown on FIG. 7, when gate oxide layer 19 is grown over the entire integrated circuit wafer, the presence of the nitrogen implants reduces the oxide growth at the level of P-type region 18. Thus, when gate oxide layer 19 is grown to obtain an average 1.2-nm thickness at the level of the P-channel MOS transistor, a gate oxide layer 19 exhibiting an average 0.8-nm thickness is obtained at the level of the bipolar transistor. A polysilicon layer 20 is then grown as in the previously described embodiments.

FIG. 8 shows two multiple-layers 25, 26 remaining in place after removal of polysilicon layer 20 and of gate oxide 19. Multiple-layer 25, located on the bipolar transistor side, exhibits a gate oxide portion 27 modified with respect to that of multiple-layer 26 located on the P-channel MOS transistor side.

FIG. 9 shows the final steps of this third embodiment which are identical to those of the preceding embodiment. The presence of very thin oxide layer 27 allows diffusion of the dopants present in polysilicon portion 28 during the activation anneal, to form an emitter area 37.

According to an alteration of the third embodiment of the invention, instead of nitrogen, any element can be used to prohibit the growth, on the bipolar transistor side, of an oxide layer or, at least, to limit the depth of such an oxide layer on the bipolar transistor side so that the oxide layer is locally thin and allows, on the bipolar transistor side, the diffusion of the dopants present in polysilicon portion 28.

Thus, according to the embodiment of the present invention, it becomes possible to manufacture on an integrated circuit MOS-type transistors and bipolar transistors with a minimum number of steps specific to the bipolar transistor. The essential differences include, on the one hand, the implantation of a P-type doped region, for example corresponding to the implantation of the sources and drains of the P-channel MOS transistor, to form the intrinsic base of the NPN transistor, and on the other hand, the step of modifying the gate oxide layer so that it does not oppose the passing of the dopants, during the activation anneal, to form the emitter area.

In the foregoing, specific embodiments of the present invention have been described. Clearly, these embodiments are likely to have alterations and modifications which will readily occur to those skilled in the art. In particular, all conductivity types may be inverted to simultaneously form an N-channel MOS transistor and a PNP bipolar transistor.

Further, although the present invention has been described in the context of the manufacturing, on an integrated circuit, MOS-type transistors and bipolar transistors, it may apply to the simultaneous manufacturing on an integrated circuit of MOS-type transistors and of junction field-effect transistors JFET, the control junction of the JFET field effect transistor being then obtained similarly to the emitter region of the bipolar transistor according to the method of the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a contact between a semiconductor substrate and a doped polysilicon layer deposited on the substrate with an interposed insulating layer, wherein an element adapted to making the insulating layer permeable to the migration of dopants from the polysilicon layer to the substrate is implanted through the polysilicon layer.

2. The manufacturing method of claim 1, wherein the insulating layer is a silicon oxide layer.

3. The manufacturing method of claim 2, wherein said element is hydrogen.

4. The manufacturing method of claim 2, wherein said element is silicon or germanium.

5. The manufacturing method of claim 3, further including an activation anneal, wherein the implanted hydrogen combines with the silicon oxide.

6. A method for manufacturing an emitter area of a bipolar transistor in a CMOS-type integrated circuit wafer, including the steps of:

forming, on the wafer, an insulating layer topped with a polysilicon layer over the entire integrated circuit;

in a bipolar transistor area, implanting through the polysilicon layer an element adapted to making the insulating layer permeable to migration of dopants from the polysilicon layer; and removing the polysilicon layer and the insulating layer outside of locations where an emitter of bipolar transistor and gates of the MOS transistors are desired to be formed.

7. The manufacturing method of claim 6, wherein the insulating layer is a silicon oxide layer.

8. The method of claim 7, wherein the implantation step includes the implantation of silicon or germanium.

9. The method of claim 7, wherein the implantation step includes the implantation of hydrogen.

10. A method for manufacturing a bipolar transistor in an integrated circuit of CMOS type, including the steps of:

forming, in an integrated circuit substrate, a region adapted to forming a collector area of the bipolar transistor;

implanting, in the region, a doped region adapted to forming a base of the bipolar transistor; and forming the emitter of the bipolar transistor by the method of claim 6.

11. A method for manufacturing an emitter area of a bipolar transistor in a CMOS-type integrated circuit, including the steps of:

implanting, in a bipolar transistor area, an element able to prevent formation of an electrically insulating layer on said bipolar transistor area;

forming an electrically insulating layer over the entire integrated circuit outside of the implanted area;

forming a polysilicon layer over the entire integrated circuit; and removing the polysilicon layer and the electrically insulating layer outside of the locations where a bipolar transistor emitter and MOS transistor gates are desired to be formed.

12. A method as defined in claim 11, wherein implanting an element comprises implanting nitrogen.

13. A method for manufacturing a contact between a semiconductor substrate and a doped polysilicon layer deposited on the substrate with an interposed insulating layer, comprising:

implanting through the polysilicon layer an element adapted to making the insulating layer permeable to the migration of dopants.

14. A method as defined in claim 13, wherein the insulating layer comprises a silicon oxide layer.

15. A method as defined in claim 14, wherein the element is selected from the group consisting of hydrogen, silicon and germanium.

16. A method for manufacturing a contact between a semiconductor substrate and a doped polysilicon layer deposited on the substrate with an interposed insulating layer, comprising:

modifying the insulating layer to promote migration of dopants from the polysilicon layer to the substrate.

17. A method as defined in claim 16, wherein the insulating layer comprises a silicon oxide layer.

18. A method as defined in claim 17, wherein modifying the insulating layer comprises implanting in the insulating layer an element selected from the group consisting of hydrogen, silicon and germanium.

19. A method for manufacturing an emitter area of a bipolar transistor in a CMOS-type integrated circuit, comprising:

implanting, in a bipolar transistor area, an element selected to limit formation of an insulating layer on the bipolar transistor area;

forming an insulating layer over the integrated circuit;

forming a polysilicon layer over the integrated circuit; and removing the polysilicon layer and the insulating layer outside locations where a bipolar transistor emitter and MOS transistor gates are to be formed.

20. A method as defined in claim 19, wherein implanting an element comprises implanting nitrogen.

* * * * *